(12) United States Patent
Takizawa et al.

(10) Patent No.: US 7,571,732 B2
(45) Date of Patent: Aug. 11, 2009

(54) IGNITION CONTROL OF REMOTE PLASMA UNIT

(75) Inventors: Masahiro Takizawa, Tama (JP); Takashi Wada, Tama (JP); Satoru Noguchi, Tama (JP)

(73) Assignee: ASM Japan K.K., Tokyo (JP)

( * ) Notice: Subject to any disclaimer, the term of this patent is extended or adjusted under 35 U.S.C. 154(b) by 634 days.

(21) Appl. No.: 11/390,832

(22) Filed: Mar. 28, 2006

(65) Prior Publication Data

US 2007/0235060 A1 Oct. 11, 2007

(51) Int. Cl.
*B08B 6/00* (2006.01)
(52) U.S. Cl. .......................... 134/1.2; 134/1.3; 134/18; 156/345.35; 315/111.21; 315/111.41; 438/17
(58) Field of Classification Search .............. 134/1, 134/1.1, 1.2, 1.3, 18, 58 R; 156/345.35; 118/715, 723 E; 356/316; 315/111.21, 111.51, 315/111.41, 289; 438/16, 17, 10
See application file for complete search history.

(56) References Cited

U.S. PATENT DOCUMENTS

| | | | | |
|---|---|---|---|---|
| 7,072,028 B2 * | 7/2006 | Powell et al. | .................. | 356/72 |
| 2006/0228473 A1 * | 10/2006 | Satoh et al. | .............. | 427/248.1 |
| 2008/0251104 A1 * | 10/2008 | Chen et al. | ..................... | 134/18 |

* cited by examiner

*Primary Examiner*—Haissa Philogene
(74) *Attorney, Agent, or Firm*—Knobbe, Martens, Olson & Bear LLP

(57) ABSTRACT

A method of maintaining a remote plasma unit for cleaning a semiconductor-processing apparatus includes: (i) detecting if the semiconductor-processing apparatus is in an idle state; (ii) if the idle state is detected, igniting the remote plasma unit for cleaning the semiconductor-processing apparatus after a lapse of a given time period; (iii) detecting if the remote plasma unit is ignited in step (ii); and (iv) if the remote plasma unit is not ignited in step (ii), retrying ignition of the remote plasma unit.

15 Claims, 7 Drawing Sheets

IGNITION CONTROL OF REMOTE PLASMA UNIT

BACKGROUND OF THE INVENTION

1. Field of the Invention

The present invention generally relates to operation of a remote plasma unit connected to a semiconductor-processing apparatus, and particularly to a method of maintaining the remote plasma unit.

2. Description of the Related Art

Chemical Vapor Deposition (CVD) is a processing method widely used in the semiconductor industry. In a CVD process, a thin film is formed on a semiconductor wafer substrate by causing a chemical reaction of various gases in a process container. There is a method of generating gaseous plasma during a deposition process to allow thin film deposition on the substrate at a lower temperature and at a higher deposition rate in the process container. This type of process is called a Plasma-Enhanced CVD (PECVD) process.

A thin film is also deposited on a wall surface of the process container and on other parts during deposition processing and particles are generated. If these particles adhere to the substrate, considerable damage is caused in a minute semiconductor-processing process; hence such contamination particles must be removed.

Consequently, in a PECVD process, it is necessary to remove film accumulation resulted from a previous process by regularly cleaning the process container. Cleaning processing is achieved normally by introducing a fluorinated gas such as NF3 into the process container.

In the cleaning processing as well, plasma is generated in order to remove film accumulation efficiently. Hitherto, as shown in FIG. 1, an In-Situ cleaning method in which plasma 4 is generated using parallel flat-plate type electrodes (an upper electrode 2 and a lower electrode 3) disposed in a process container 1 was used. In recent years, however, remote plasma cleaning went into wide use for the following reasons: (1) Less electrode damage is caused because ion bombardment is not developed in the process container; (2) cleaning of portions other than the electrodes is possible; (3) dissociation efficiency is high because large-amount power input is possible.

More specifically, as shown in FIG. 2, the remote plasma cleaning is a cleaning method in which a plasma is generated in a remote plasma unit (RPU) 5 provided outside the process container 1, F radicals 6 are generated by decomposing a fluorinated gas by the plasma, and cleaning is performed by introducing the F radicals generated into the process container.

SUMMARY OF THE INVENTION

In order to perform remote plasma cleaning, it is necessary to install a remote plasma unit (RPU) in a semiconductor-processing apparatus and to ignite an ignition plug of the RPU prior to cleaning processing. Igniting the RPU tends to become difficult, if it is not ignited for a certain time period, for example, due to wafer-lot replacement, etc. Once ignition fails, it requires time to make the RPU to work again and a process container cannot be used during that time, thereby lowering a throughput (the number of wafers processed per unit time) of the semiconductor-processing apparatus.

Additionally, if a semiconductor-processing apparatus has plural process containers and RPU ignition for only one of the process containers fails, the wafer processing order, i.e., the order in which wafers are processed in process containers in relation to each other and each process container, is changed and this change may affect the process.

The present invention is achieved in view of the problems described above. In an aspect, an object of the present invention is to solve at least one of the problems by igniting a RPU at regular intervals during a time period when a semiconductor-processing apparatus is not used, for example, a time period between processes of semiconductor processing by the tally, etc.

Furthermore, in order to ignite a RPU, it is necessary to execute a recipe exclusively used for this purpose, which is described later. If a RPU ignition interval is too short during a time period when a semiconductor-processing apparatus is not used, unnecessary costs incur. Conversely, if the ignition interval is too long, ignition failure occurs as described above and apparatus throughput is lowered. Consequently, it is desirable to set a time interval of RPU ignition at an optimum value, which is not too short or not too long.

In an aspect of the present invention, in order to minimize costs required for RPU ignition, another object of the present invention is to realize a function for optimizing a time interval of RPU ignition.

In an aspect of the present invention which achieves at least one of the objects described above, a RPU automatic ignition control function is incorporated in a controller of a semiconductor-processing apparatus. This function monitors if a given time period has elapsed for the apparatus without RPU ignition. If it is determined that the given time period has elapsed, a recipe exclusively used for RPU ignition is executed to a process container. The recipe is executed because it is necessary to introduce a gas required for ignition such as Ar (argon) into the process container when a RPU is ignited.

Additionally, in yet another aspect which achieves at least one of the objects described above, in order to obtain an optimum time-interval value for RPU ignition, a value of the next ignition time is increased or decreased by dichotomy using information of successful ignition and unsuccessful ignition. If change in an ignition time value becomes a given value or less, an ignition time value at that time is fixed as an optimum value.

According to at least one of the above-mentioned aspects, in cleaning processing of a semiconductor-processing apparatus, particularly in remote plasma cleaning processing, it becomes possible to ignite a RPU always successfully at an optimum time, hence to prevent lowering of a semiconductor wafer manufacturing throughput and increasing of operation costs.

Additionally, for a remote plasma unit, there are two methods, one in which a RPU is ignited by an ignition plug and the other in which plasma is generated via an induction coil. The present invention applies mainly to the former method. For example, ASTRON(®) (manufactured by MKS) adopts this method. The present invention, however, is able to apply to all ignition systems in which ignition tends to become difficult if they are not ignited for a certain time period. Additionally, adhesion of residual gas or moisture to a surface of an ignition plug is considered to cause ignition difficulty although the present invention is not limited to the cause.

For purposes of summarizing the invention and the advantages achieved over the related art, certain objects and advantages of the invention have been described above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description of the preferred embodiments which follow.

BRIEF DESCRIPTION OF THE DRAWINGS

These and other features of this invention will now be described with reference to the drawings of preferred embodiments which are intended to illustrate and not to limit the invention. The drawings are oversimplified for illustrative purposes and are not to scale.

DETAILED DESCRIPTION OF THE PREFERRED EMBODIMENT

Figure 1:
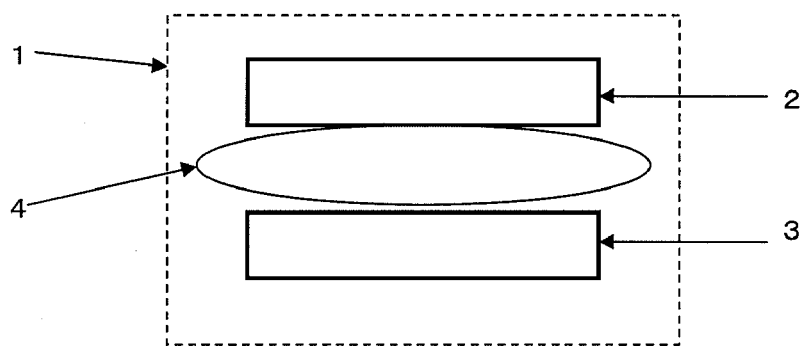
FIG. 1 is a conceptual diagram showing a state inside a reaction chamber when in-situ cleaning is conducted.

As described above, in an aspect of the present invention, in a semiconductor-processing apparatus, particularly in a remote plasma unit (RPU), a method of reliably igniting an ignition plug, which is a component of a chemical vapor deposition (CVD) apparatus, when a cleaning process is conducted, is provided; furthermore, in an aspect, a method of implementing the above method at low operation costs is provided.

In an aspect, a method of maintaining a remote plasma unit for cleaning a semiconductor-processing apparatus, comprises: (i) detecting if the semiconductor-processing apparatus is in an idle state; (ii) if the idle state is detected, igniting the remote plasma unit for cleaning the semiconductor-processing apparatus after a lapse of a given time period; (iii) detecting if the remote plasma unit is ignited in step (ii); and (iv) if the remote plasma unit is not ignited in step (ii), retrying ignition of the remote plasma unit.

The above aspect includes, but is not limited to, the following embodiments:

The method may further comprise step (v) of repeating steps (i) to (iv) if the remote plasma unit is ignited in step (ii) or (iv). In the above, the method may further comprise between steps (iv) and (v), step (vi) of changing the given time period depending on whether the remote plasma unit is ignited on a first attempt of ignition in step (ii).

Step (v) may comprise decreasing the given time period when the remote plasma unit is not ignited. In an embodiment, in step (v), the given time period may be decreased to a value m calculated by dichotomy wherein m=(a+b)/2, wherein a is a greatest value of the given time period where the remote plasma unit is previously ignited or a is zero if there is no previous value of the given time period, and b is the current value of the given time period. In an embodiment, the given time period may be decreased to the value m only when a difference between m and b is greater than a threshold value.

Step (v) may comprise increasing the given time period when the remote plasma unit is ignited. In an embodiment, in step (v), the given time period may be increased to a value m calculated by dichotomy wherein m=(b+c)/2, wherein c is a smallest value of the given time period where the remote plasma nit is previously not ignited or c 2b if there is no previous value, and b is the current value of the given time period. In an embodiment, the given time period may be increased to the value m only when a difference between m and b is greater than a threshold value.

Step (i) may further comprise detecting if the semiconductor-processing apparatus is in a maintenance state, and the method further comprises a step of overriding step (ii) and prohibiting ignition of the remote plasma unit if the maintenance state is detected.

Step (iv) may comprise retrying a given number of times ignition of the remote plasma unit, and the method further comprises indicating a warning if the remote plasma unit is not ignited upon step (iv).

Step (iii) may detect if the remote plasma unit is ignited based on a change of an electric current passing through a coil for maintaining a plasma provided in the remote plasma unit. The change can be determined if the electric current exceeds a pre-selected threshold.

In another aspect, a method of cleaning a semiconductor-processing apparatus using a remote plasma unit, comprises: (I) operating the semiconductor-processing apparatus; (II) upon end of the operation of the semiconductor-processing apparatus, igniting the remote plasma unit and exciting a cleaning gas in the remote plasma unit, thereby cleaning the semiconductor-processing apparatus; and (III) initiating a method of claim 1 to ignite the remote plasma unit when the semiconductor-processing apparatus is in an idle state.

The above aspect includes, but is not limited to, the following embodiments:

Steps (I)-(III) may be controlled by recipes. Steps (I) and (II) may be conducted by a main program, and step (III) may be conducted by a subroutine which is called by the main program.

In still another aspect, a semiconductor-processing apparatus comprises a main program for controlling operation of the semiconductor-processing apparatus and cleaning thereof using a remote plasma unit, said main program comprising a subroutine for maintaining the remote plasma unit by a method comprising: (i) detecting if the semiconductor-processing apparatus is in an idle state; (ii) if the idle state is detected, igniting the remote plasma unit for cleaning the semiconductor-processing apparatus after a lapse of a given time period; (iii) detecting if the remote plasma unit is ignited in step (ii); and (iv) if the remote plasma unit is not ignited in step (ii), retrying ignition of the remote plasma unit.

In all of the aforesaid aspects and embodiments, any element used in one aspect or embodiment can interchangeably or additionally be used in another embodiment unless such a replacement is not feasible or causes adverse effect. Further, the present invention can equally be applied to methods and apparatuses.

The present invention will be explained with respect to preferred embodiments and drawings. However, the preferred embodiments and drawings are not intended to limit the present invention.

Figure 7:
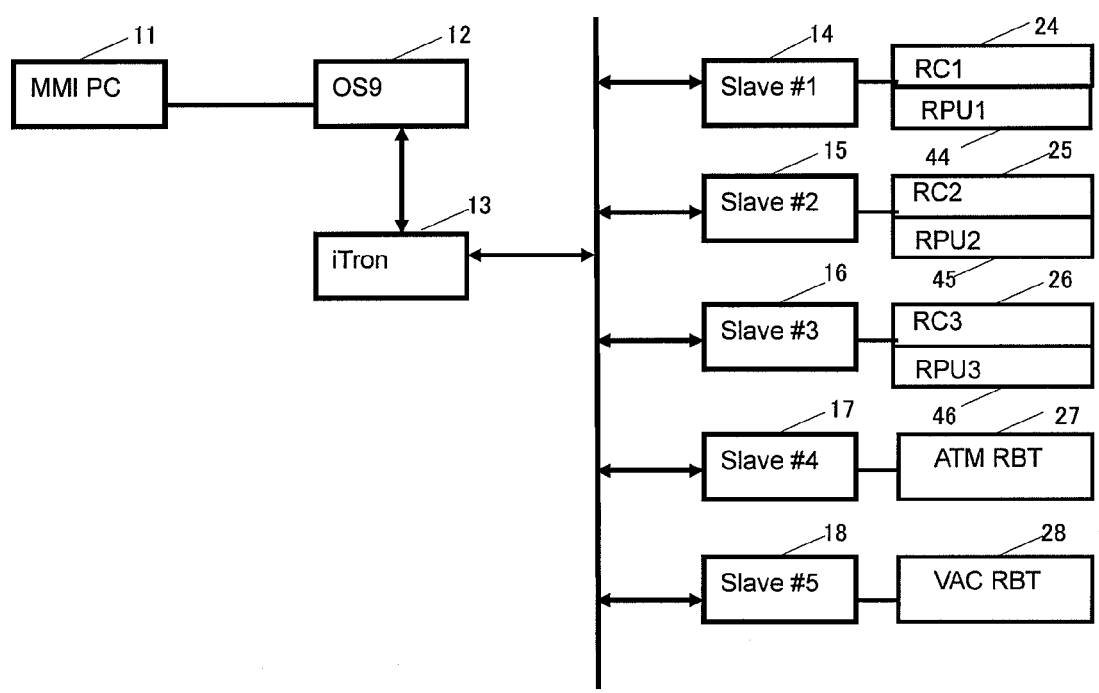
FIG. 7 is a schematic diagram showing a control system of a semiconductor-processing apparatus and an RPU according to an embodiment of the present invention.

FIG. 7 is a schematic diagram showing an example of configuration of a control system of a semiconductor-processing apparatus. A system recipe, a process recipe, a cleaning recipe, etc. are set from a MMI PC (Man Machine Interface; a PC for display) 11. Information is sent from the MMI PC 11 to a CPU board (used for communicating with the MMI PC; OS9) 12, from which it is inputted to the CPU board (a main controller; iTron) 13. By the system recipe which uses the inputted information as a subroutine, the iTron 13 instructs to execute recipes (a process recipe, a cleaning recipe) to Slave boards 14 to 18, wherein respectively Slave#1 14 controls a reaction chamber 24 (RC 1) and a remote plasma unit 44 (RPU1); Slave#2 15 controls a reaction chamber (RC2) 25 and a remote plasma unit 45 (RPU2); Slave#3 16 controls a reaction chamber 25 (RC3) and a remote plasma unit 46 (RPU3); Slave#4 17 controls an atmospheric robot 27 (ATM RBT); and Slave#5 18 controls a wafer transfer container and a vacuum robot 28 (VAC RBT).

In order to control RPU ignition when a RPU is in an idle state, an ignition control subroutine is called from the main program running on the iTron 13, from which Slave#1-3 14-16 are respectively instructed to execute a RPU ignition control recipe.

Figure 8:
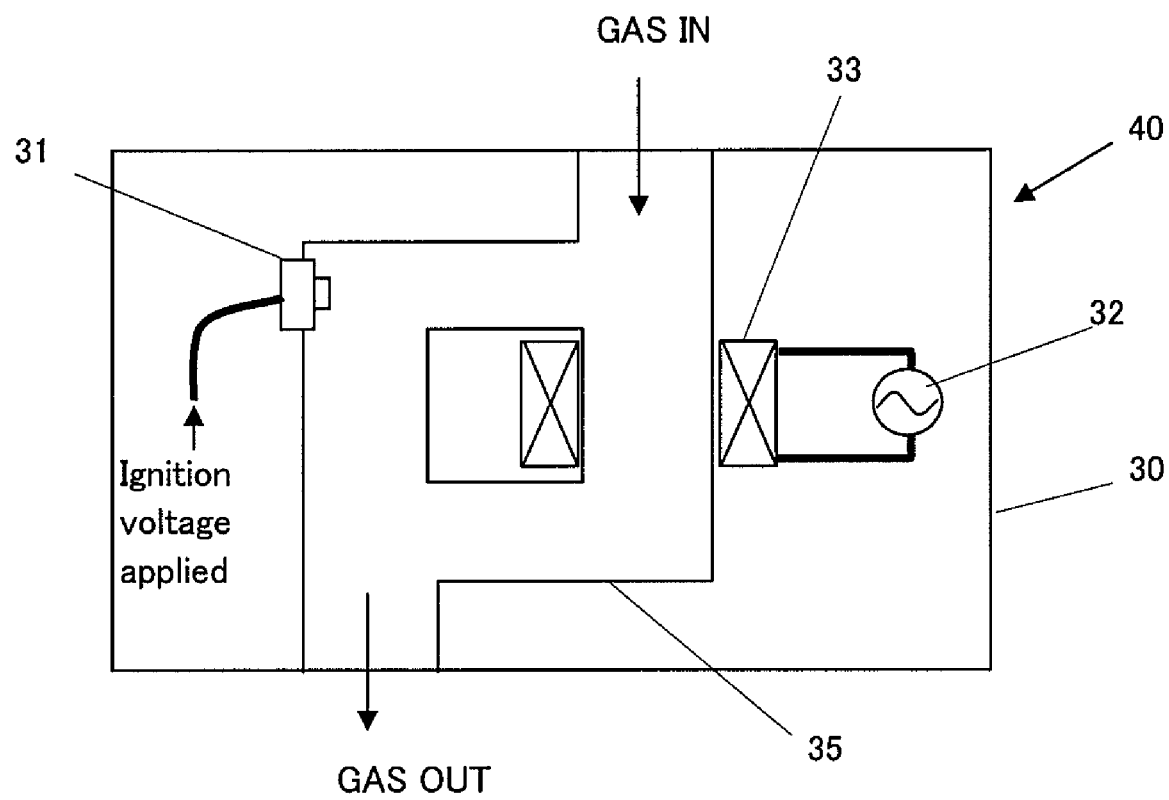
FIG. 8 is a schematic diagram of an RPU according to an embodiment of the present invention.

FIG. 8 is a schematic diagram showing an example of a configuration of a RPU 40. Inside a RPU chamber 30, a ring coil 33 for maintaining a plasma is disposed and connected with a power source 32. A gas passes through electrodes inside a reaction chamber 35, is excited and sent to a semiconductor-processing apparatus from the RPU chamber. An ignition plug 31 is installed inside the chamber and a plasma is ignited. The ignition plug 31 is ignited normally by applying ignition voltage. Whether it is ignited can be detected by change in an electric current value passing through the coil 33. It is because an electric current value passing through the coil 33 changes upon plasma generation.

Figure 3:
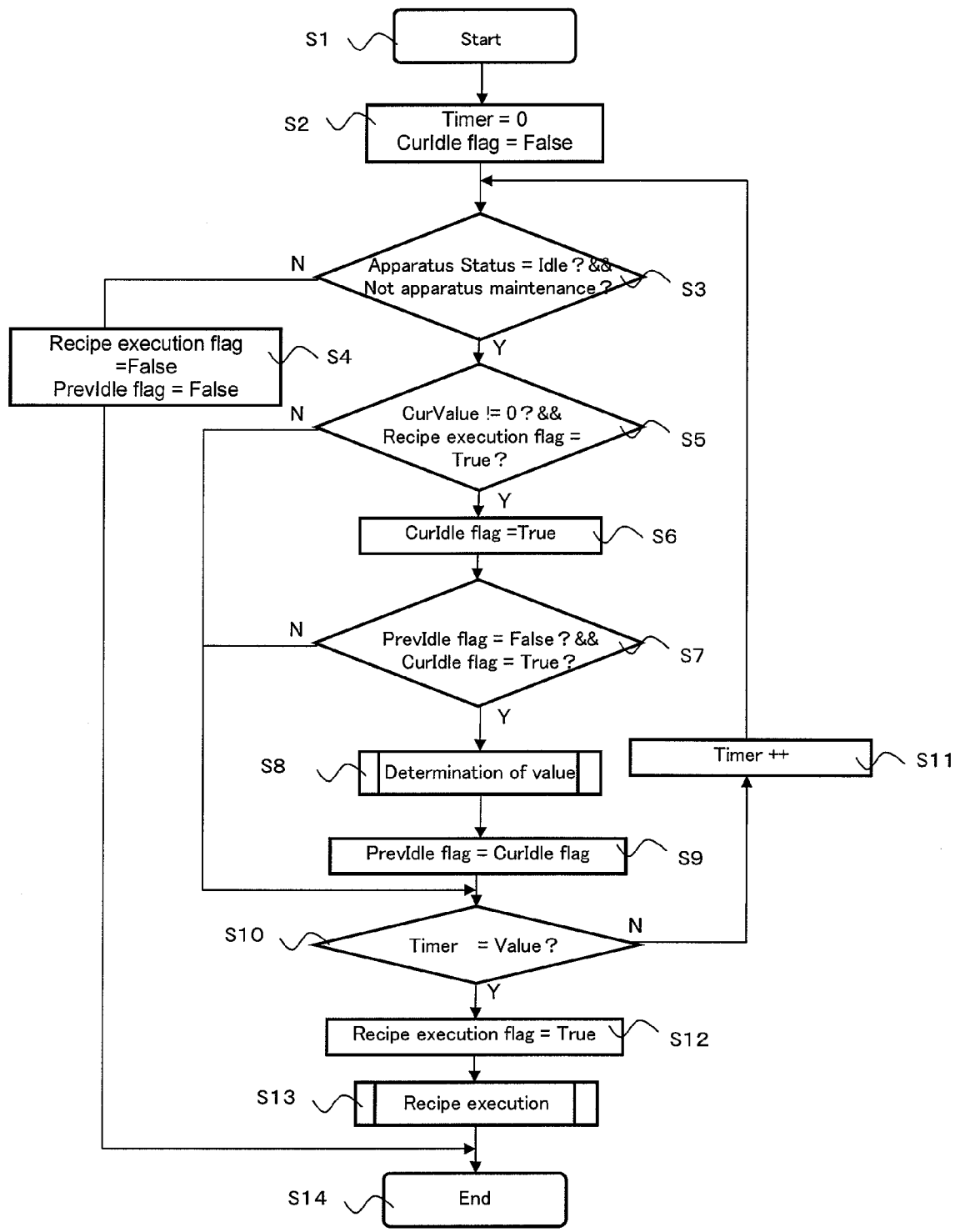
FIG. 3 is a flowchart explaining an automatic ignition function of a remote plasma unit (RPU) according to an embodiment of the present invention.

FIG. 3 is an example of a flowchart for controlling RPU ignition when the apparatus is not used for a given time period. This chart explains a subroutine (function) called from a main program running on the controller of the semiconductor-processing apparatus.

Processing starts at Step 1. In Step 2, "zero" is substituted for a variable Timer. This initializes a timer for measuring an idle time of the apparatus. Additionally, a CurIdle flag is set to False, wherein a flag in a software program is a variable which only takes a value, True (1) or False (0). The CurIdle is a flag for detecting if the apparatus is currently in an idle state (to be described later).

Step 3 detects if the apparatus is in an idle state or in a maintenance state, wherein the idle state is a state in which the apparatus is not in operation at all; this step checks not only if CVD processing is in operation in a process container but also if wafer transfer is in execution. Additionally, if the apparatus is in the maintenance state, it is not in operation; recipe execution in this state, however, is prohibited in order to ensure safety of a worker performing maintenance work around the apparatus. When the apparatus is in the maintenance state, the maintenance state is set, for example, from the MMI PC 11. If set, the state is displayed on the apparatus; and wafer processing and any other processes cannot be conducted until the maintenance state is cancelled. In this state, the worker engages in part replacement work and so forth.

Additionally, in an aspect, preferably status information and maintenance information of the apparatus are specified as global variables in a software program and can be referred from a subroutine as well, although they are decided in the main program running on the controller iTron 13. A global variable is a program variable which can be commonly referred in a main program and in a subroutine (function). Consequently, it becomes possible to detect if the apparatus is in an idle state or in a maintenance state not only from the main program but also from the RPU ignition control subroutine.

If Step 3 detects that the apparatus is not in the idle state but in the maintenance state, the subroutine advances to Step 4. If it detects that the apparatus is in the idle state and not in the maintenance state, the subroutine advances to Step 5. In Step 4, a Recipe Execution flag and a PrevIdle flag are set to False for initialization. The Recipe Execution flag is a flag for detecting if the value of an Ignition Time Interval was changed and the RPU ignition recipe was executed. As long as the value of this flag is not changed to True, the value of an Ignition Time Interval is not changed (See Step 5.). The PrevIdle flag is a flag required for changing a value of an Ignition Time Interval only at an initial time in a loop in which the variable Timer is incremented (Step 10→Step 11→Step 3) (See Step 7.).

From Step 4, the subroutine advances to Step 14 and ends. Step 5 detects if the value of the variable CurValue is zero and if the value of the Recipe Execution flag is True. The variable CurValue is a storage variable to store a temporary value of the Ignition Time Interval, which is used in the Value Determined subroutine described later. As zero is set as an initial value, it is used so as to use the initial value of the Ignition Time Interval as it is. The Recipe Execution flag is True only when the Value Timer reaches the Value and the RPU Ignition Recipe is executed (See Step 12.). Consequently, in this case, Step 5 detects if the value of the Ignition Time Interval is the initial value and if it is immediately after the RPU Ignition Recipe was executed. In Step 5, if it is detected that the CurValue is not zero and the Recipe Execution flag is True, the subroutine advances to Step 6. If it is detected that the CurValue is zero or the Recipe Execution flag is not True, the subroutine advances to Step 10.

In Step 6, the CurIdle flag is set to True. Step 7 detects if the PrevIdle flag is False and if the CurIdle is True. This detection is a necessary process to change the Ignition Time Interval only at an initial time in a loop in which the Timer variable is incremented because the value of the CurIdle flag will be set in the PrevIdle in Step 9 described later. In Step 7, if it is detected that the PrevIdle flag is False and the CurIdle flag is True, the subroutine advances to Step 8. If it is detected that the PrevIdle flag is True or the CurIdle flag is False, the subroutine advances to Step10.

Step 8 is a Value Determined subroutine described later, wherein the value of the Ignition Time Interval is determined by dichotomy. In Step 9, the value of the CurIdle flag is set to the value of the PrevIdle flag. This is necessary for changing the value of the Ignition Time Interval only once at an initial time by determination made in Step 7 of the loop in which the variable Timer is incremented. Step 10 detects if the value of the variable Timer is equal to the value of the Ignition Time Interval. If it is equal, the subroutine advances to Step 12; if not, the subroutine advances to Step 11.

In Step 11, the variable Timer is incremented and the subroutine returns to the detection in Step 3. In Step 12, the Recipe Execution flag is set to True. This is the flag which is set to True only when the RPU Ignition Recipe is to be executed in the next step and used in the detection in Step 5. This is used to change the value of the Ignition Time Interval if the apparatus is not in the idle state before the variable Timer reaches the Value in the loop in which the variable Timer is incremented.

In Step 13, because the Ignition Time Interval has elapsed while the apparatus remains in the idle state, the RPU Ignition Recipe described later is executed. In Step 14, the subroutine ends.

Figure 4:
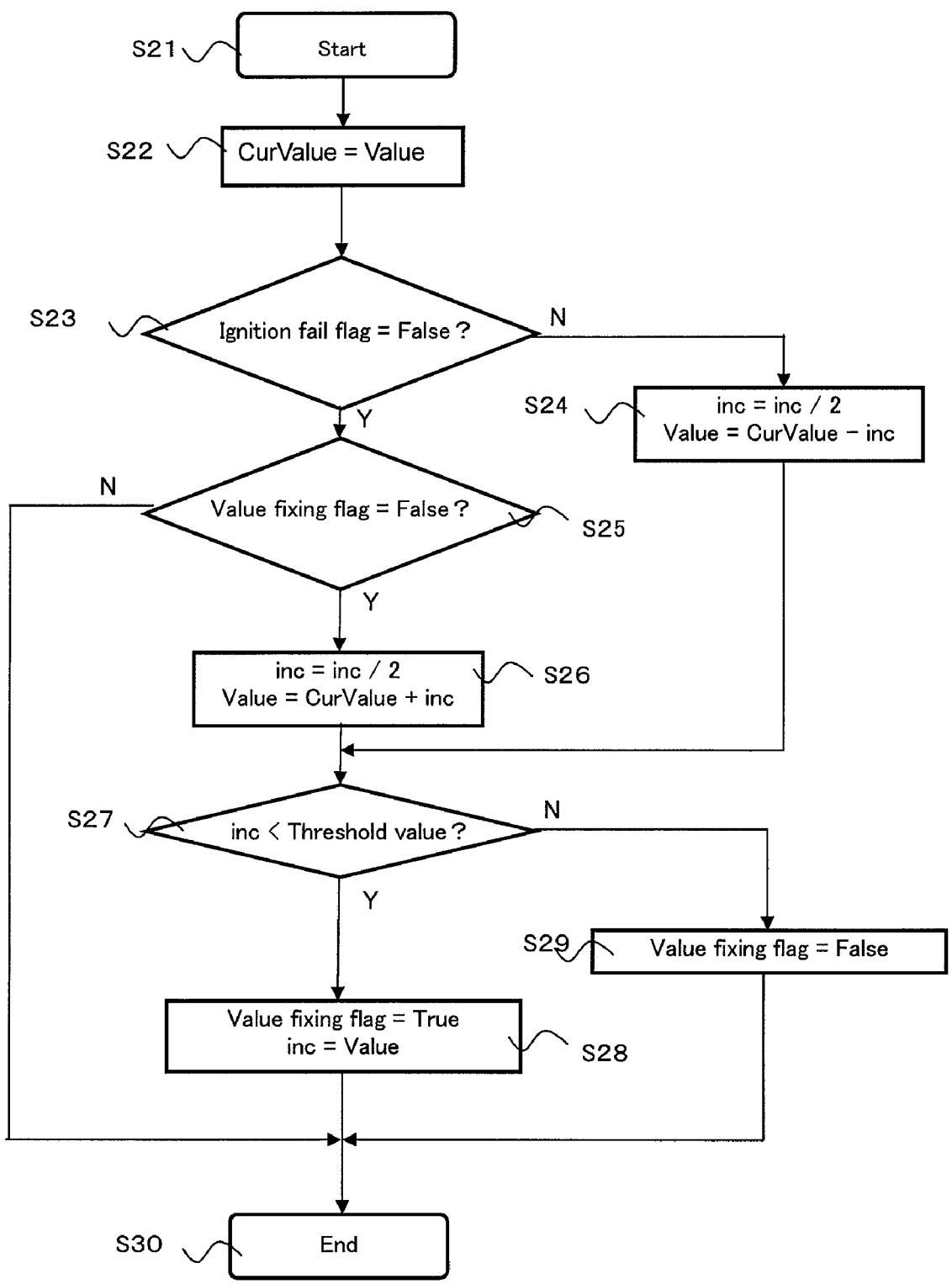
FIG. 4 is a flowchart explaining a subroutine for determining an ignition interval according to an embodiment of the present invention.

FIG. 4 shows an example of the Value Determined subroutine called in Step 8 in the flowchart shown in FIG. 3. The subroutine starts at Step 21. In Step 22, the variable CurValue is set to a current value of an Ignition Time Interval. The CurValue is a storage variable to store a temporary value of the Ignition Time Interval.

Step 23 detects if an Ignition Failure flag is set to False, wherein the Ignition Failure flag is a software flag a value of which is determined in the RPU recipe described later. Using this information, the value of the Ignition Time Interval is changed (The interval is shortened if the ignition fails; the interval is lengthened if the ignition is successful). If it is detected that the Ignition Failure is False (the ignition was successful.), the subroutine advances to Step 25; if not, the subroutine advance to Step 24.

In Step 24, a variable inc is divided by 2 and a value obtained by subtracting the value of inc from the variable CurValue is set as the Value, wherein the variable inc is used to change the Value. If RPU ignition failed, the Value decreases by half; if it is successful, the Value doubles (because dichotomy is used.). The subroutine advances to Step 27 from Step 24. Step 24 detects if a Value Fixation flag is set to False, wherein the Value Fixation flag is used not to change the Value further assuming that the Value of the Ignition Time Interval has reached the highest value when the variable inc drops below a threshold value. If the ignition failed, however, the value of the Value Fixation flag is changed to False again. If it is detected that the value of the Value Fixation flag is False, the subroutine advances to Step 24; if not, the subroutine advances to Step 30 and ends.

In Step 26, the value of the variable inc is divided by 2, and a value obtained by adding the value of the variable inc to the variable CurValue is set to the Value (because the ignition was successful.). Step 27 detects if the value of the variable inc is smaller than the threshold value. If it is detected that the value is smaller, the subroutine advances to Step 28, if not, the subroutine advances to Step 29. In Step 28, The Value Fixation flag is set to True, and the value of the variable inc is set to the Value. Although the value of the Ignition Time Interval is optimum at that point of time, this is performed in order to restart increase and decrease in the value of the Time Interval from the Value if the ignition failed for some reason.

In Step 29, the Value Fixation flag is set to False. This is to change the Value again because the value of the variable inc is larger than the threshold value. The subroutine advances to Step 30 and ends.

In the flowchart shown in FIG. 4, the value of the Ignition Time Interval value is calculated by dichotomy and changed, for example, as described below.

(Initial value) 60 min→Ignition failed→30 min→Ignition was successful→45 min→Ignition failed→37.5 min→Ignition was successful→41.25 min→Ignition failed→39.375 min . . . , wherein the value is fixed in 39.375 min. (until the ignition will fail next) if the threshold value of the variable inc is, e.g., 3 min.

Figure 2:
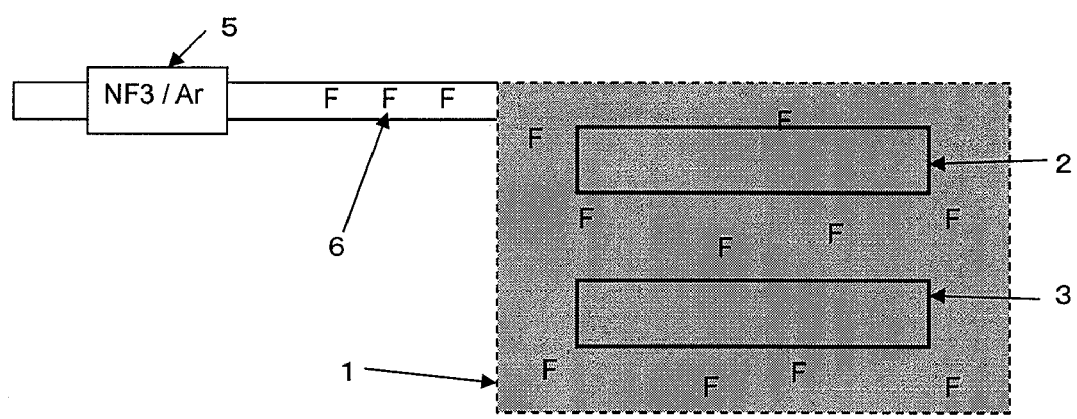
FIG. 2 is a conceptual diagram showing a state inside a reaction chamber when remote plasma cleaning is conducted.
Figure 5:
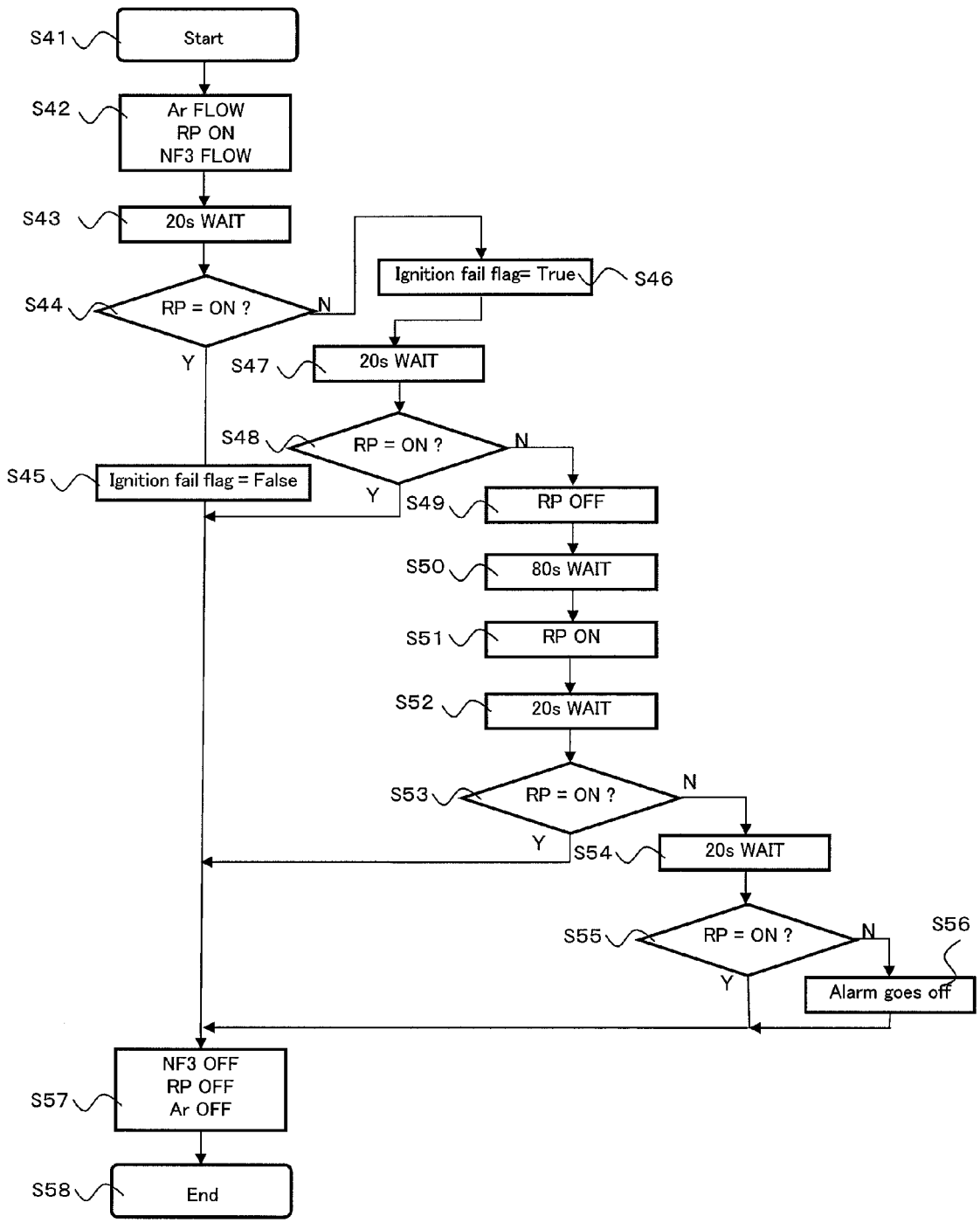
FIG. 5 is a flowchart explaining an example of a recipe executed in the automatic ignition control of an RPU according to an embodiment of the present invention.

FIG. 5 shows an example of processing a recipe exclusively used for igniting a RPU. The processing starts at Step 41. In Step 42, Ar is introduced into the RPU. This is to facilitate to generate F radicals by reacting Ar with NF3 in the RPU (See FIG. 2.). Additionally, a command (RP ON) to ignite the RPU is issued, and NF3 is introduced. In Step 43, Wait processing is performed for 20 sec. Step 44 detects if the RPU was ignited. At this time, if the RPU was ignited, the processing advances to Step 45, and the Ignition Failure flag is set to False; if not, the processing advances to Step 46.

In Step 46, the Ignition Failure is set to True. In Step 47, Wait processing is performed again for 20 sec. Step 48 detects if the RPU was ignited. If it was ignited, the processing advances to Step 57. If not, the processing advances to Step 49.

In Step 49, the Ignition processing is stopped once, and the Wait processing is performed for 80 sec. in Step 50. In Step 51, the Ignition processing of the RPU is resumed, and the Wait processing is performed for 20 sec. in Step 52. Step 53 detects if the RPU was ignited. If the RPU was ignited, the processing advances to Step 57; if not, the processing advances to Step 54.

The Wait processing is performed for 20 sec. in Step 54. Step 55 detects if the RPU was ignited. If the RPU was ignited, the processing advances to Step 57, flow of NF3, RP, Ar is turned OFF, and the processing ends in Step 58. If the RPU was not ignited, a warning is issued in Step 56. This warning is to notify a possibility that there may be some fundamental problem (malfunction inspection or replacement of the RPU may be required) because RPU ignition failed after plural times of RPU Ignition Retries. In Step 57, flow of NF3, RP, Ar is turned OFF in Step 57, and the recipe ends in Step 58. The reason for turning OFF flow of NF3, Ar in Step 57 is that running cost will increase if flow of respective gases continues in the idle state. Additionally, if gas flow is stopped, the ignition of the RPU goes out; however, as a precautionary measure, the gas flow is turned OFF by issuing a command. Wait time of 20 sec. or 80 sec. in this flowchart is just an example.

Figure 6:
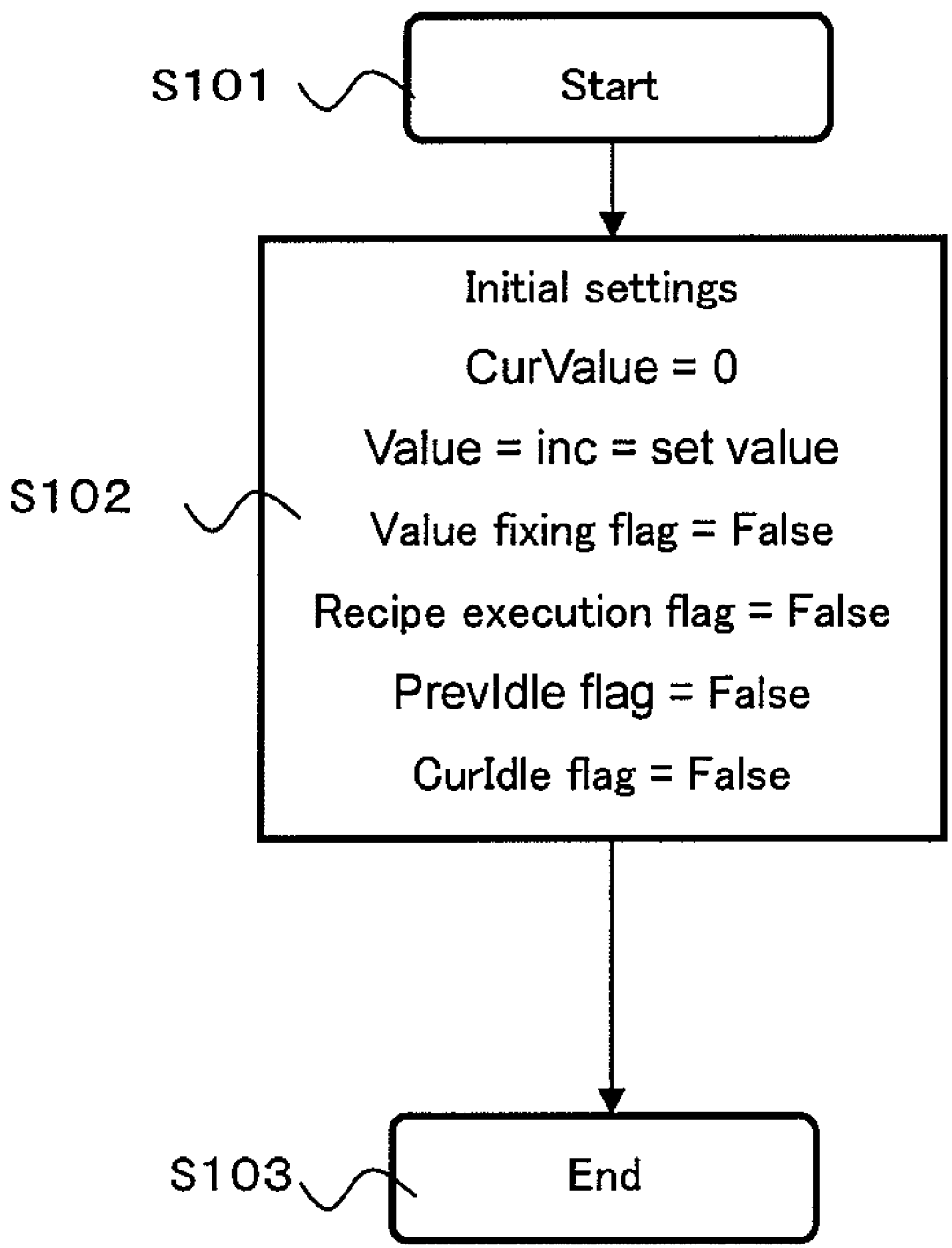
FIG. 6 is a flowchart explaining initialization of software of the automatic ignition control of an RPU according to an embodiment of the present invention.

FIG. 6 is an example of initialization processing of variables and flags used in the flowcharts shown in FIG. 3 and FIG. 4. The processing starts at Step 101. In Step 102, variables CurValue, Value, and inc, and Value Fixation, Recipe Execution, PrevIdle and CurIdle flags are initialized. The processing ends in Step 103. Normally, this initialization processing is executed only once when the power of the controller is turned ON. If needed, however, it is also acceptable that the initialization processing can be executed on the controller any time.

Additionally, an example of automatically executing the recipe exclusively used for igniting a RPU when the apparatus is in the idle state for a given time period is shown in this figure. Practically, there is an apparatus having a problem that a number of contaminated particles are generated inside a process container if operation of the apparatus is resumed after it has not been used for a long time period due to maintenance. In this case, not only the RPU Ignition recipe, but also a recipe including deposition processing (in a state in which no wafer is in the process container) and cleaning processing may be regularly executed.

As described above, using the RPU automatic ignition control function of the present invention, a RPU can be ignited without fail even if a semiconductor-processing apparatus has been through a long period of idle time between wafer processes, thereby making it possible to continue wafer possessing without lowering a throughput. Additionally, by providing the function to optimize an ignition interval of the RPU, apparatus operating cost can be lowered as compared with the case in which the RPU is ignited at a fixed time interval.

The present invention includes the above mentioned embodiments and other various embodiments including the following:

1) A semiconductor-processing apparatus comprising a software program controlling ignition of a remote plasma unit, which is characterized in that the software program executes a recipe which ignites the remote plasma unit by detecting if the semiconductor-processing apparatus is in an idle state.

2) The semiconductor-processing apparatus described in 1) above, wherein the software program is characterized by executing the recipe upon a lapse of a given time period if the semiconductor-processing apparatus remains in the idle state.

3) The semiconductor-processing apparatus described in 1) above, wherein the software program is characterized by prohibiting execution of the recipe when the semiconductor-processing apparatus is in a maintenance state.

4) The semiconductor-processing apparatus described in 1) above, wherein the recipe detects failure in ignition of the remote plasma unit and retries to ignite it automatically.

5) The semiconductor-processing apparatus described in 2) above, wherein the given time period is characterized in that it is changed according to a result of ignition of the remote plasma unit.

6) The semiconductor-processing apparatus described in 5) above, wherein the given time period is characterized in that it is shortened if the ignition of the remote plasma unit fails.

7) The semiconductor-processing apparatus described in 5) above, wherein the given time period is characterized in that it is lengthened if the ignition of the remote plasma unit is successful.

8) The semiconductor-processing apparatus described in 5) above, wherein the given time period is characterized in that it is determined by dichotomy according to a result of the ignition of the remote plasma unit.

9) A method of operating a semiconductor-processing apparatus comprising a remote plasma unit, which is characterized in that the remote plasma unit is operated every given time period.

10) The method described in 9) above, wherein the given time period is characterized in that it is an elapsed time during which the semiconductor-processing apparatus remains in an idle state.

11) The method described in 9) above, wherein operation of the remote plasma unit is characterized in that ignition processing.

12) The method described in 9) above, wherein operation of the remote plasma unit is characterized by including a retry to ignite the remote plasma unit after the given time period if ignition failure is detected.

In the present disclosure where conditions and/or structures are not specified, the skilled artisan in the art can readily provide such conditions and/or structures, in view of the present disclosure, as a matter of routine experimentation.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A method of maintaining a remote plasma unit for cleaning a semiconductor-processing apparatus, comprising:
    (i) detecting if the semiconductor-processing apparatus is in an idle state;
    (ii) if the idle state is detected, igniting the remote plasma unit for cleaning the semiconductor-processing apparatus after a lapse of a given time period;
    (iii) detecting if the remote plasma unit is ignited in step (ii); and
    (iv) if the remote plasma unit is not ignited in step (ii), retrying ignition of the remote plasma unit.

2. The method according to claim 1, further comprising step (v) of repeating steps (i) to (iv) if the remote plasma unit is ignited in step (ii) or (iv).

3. The method according to claim 1, wherein step (i) further comprises detecting if the semiconductor-processing apparatus is in a maintenance state, and the method further comprises a step of overriding step (ii) and prohibiting ignition of the remote plasma unit if the maintenance state is detected.

4. The method according to claim 1, wherein step (iv) comprises retrying a given number of times ignition of the remote plasma unit, and the method further comprises indicating a warning if the remote plasma unit is not ignited upon step (iv).

5. The method according to claim 2, further comprising between steps (iv) and (v), step (vi) of changing the given time period depending on whether the remote plasma unit is ignited on a first attempt of ignition in step (ii).

6. The method according to claim 5, wherein step (v) comprises decreasing the given time period when the remote plasma unit is not ignited.

7. The method according to claim 5, wherein step (v) comprises increasing the given time period when the remote plasma unit is ignited.

8. The method according to claim 6, wherein in step (v), the given time period is decreased to a value m calculated by dichotomy wherein $m=(a+b)/2$, wherein a is a greatest value of the given time period where the remote plasma unit is previously ignited or a is zero if there is no previous value of the given time period, and b is the current value of the given time period.

9. The method according to claim 7, wherein in step (v), the given time period is increased to a value m calculated by dichotomy wherein $m=(b+c)/2$, wherein c is a smallest value of the given time period where the remote plasma unit is previously not ignited or c is 2b if there is no previous value, and b is the current value of the given time period.

10. The method according to claim 8, wherein the given time period is decreased to the value m only when a difference between m and b is greater than a threshold value.

11. The method according to claim 9, wherein the given time period is increased to the value m only when a difference between m and b is greater than a threshold value.

12. The method according to claim 1, wherein step (iii) detects if the remote plasma unit is ignited based on a change of an electric current passing through a coil for maintaining a plasma provided in the remote plasma unit.

13. A method of cleaning a semiconductor-processing apparatus using a remote plasma unit, comprising:
    (I) operating the semiconductor-processing apparatus;
    (II) upon end of the operation of the semiconductor-processing apparatus, igniting the remote plasma unit and exciting a cleaning gas in the remote plasma unit, thereby cleaning the semiconductor-processing apparatus; and
    (III) initiating a method of claim 1 to ignite the remote plasma unit when the semiconductor-processing apparatus is in an idle state.

14. The method according to claim 13, wherein steps (I)-(III) are controlled by recipes.

15. The method according to claim 13, wherein steps (I) and (II) are conducted by a main program, and step (III) is conducted by a subroutine which is called by the main program.

* * * * *

UNITED STATES PATENT AND TRADEMARK OFFICE
CERTIFICATE OF CORRECTION

PATENT NO. : 7,571,732 B2  Page 1 of 1
APPLICATION NO. : 11/390832
DATED : August 11, 2009
INVENTOR(S) : Takizawa et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 770 days.

Signed and Sealed this

Seventh Day of September, 2010

David J. Kappos
*Director of the United States Patent and Trademark Office*